(12) United States Patent
Kim et al.

(10) Patent No.: US 9,236,237 B2
(45) Date of Patent: Jan. 12, 2016

(54) DISPLAY DEVICE AND MANUFACTURING METHOD THEREOF

(71) Applicant: SAMSUNG DISPLAY CO., LTD., Yongin, Gyeonggi-Do (KR)

(72) Inventors: Young Gu Kim, Hwaseong-si (KR); Byoung-Hun Sung, Hwaseong-si (KR); Baek Kyun Jeon, Yongin-si (KR); Jin-Soo Jung, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 268 days.

(21) Appl. No.: 13/693,959

(22) Filed: Dec. 4, 2012

(65) Prior Publication Data

US 2014/0049157 A1 Feb. 20, 2014

(30) Foreign Application Priority Data

Aug. 14, 2012 (KR) .................. 10-2012-0088890

(51) Int. Cl.
| | | |
|---|---|---|
| *H05B 33/04* | (2006.01) | |
| *H01J 61/24* | (2006.01) | |
| *H01J 9/24* | (2006.01) | |
| *H01L 51/52* | (2006.01) | |
| *G02F 1/1341* | (2006.01) | |
| *G02F 1/1333* | (2006.01) | |

(52) U.S. Cl.
CPC ............. *H01J 61/24* (2013.01); *G02F 1/1341* (2013.01); *H01J 9/248* (2013.01); *H01L 51/524* (2013.01); *G02F 2001/133388* (2013.01)

(58) Field of Classification Search
CPC .... H05B 33/04; H01L 51/524; H01L 51/526; H01L 51/5246; G02F 2001/133388

USPC .............. 349/153, 155–156; 313/512; 445/25
See application file for complete search history.

(56) References Cited

U.S. PATENT DOCUMENTS

| | | | |
|---|---|---|---|
| 7,436,483 | B2 | 10/2008 | Byun et al. |
| 7,952,680 | B2 | 5/2011 | Terao et al. |
| 2004/0262605 | A1 | 12/2004 | Park et al. |
| 2007/0252226 | A1 | 11/2007 | Youn et al. |
| 2009/0034176 | A1 | 2/2009 | Kim et al. |
| 2010/0296291 | A1 | 11/2010 | Kang |
| 2011/0083788 | A1 | 4/2011 | Park et al. |
| 2011/0102727 | A1* | 5/2011 | Hirato ........................... 349/153 |
| 2011/0114991 | A1 | 5/2011 | Lee |
| 2011/0135857 | A1 | 6/2011 | Logunov et al. |
| 2011/0242743 | A1 | 10/2011 | Moon |
| 2011/0316807 | A1 | 12/2011 | Corrion |
| 2012/0002129 | A1 | 1/2012 | Azai |
| 2012/0013818 | A1 | 1/2012 | Park et al. |

FOREIGN PATENT DOCUMENTS

| | | |
|---|---|---|
| KR | 10-0694530 | 3/2007 |
| KR | 1020070046544 A | 5/2007 |

(Continued)

*Primary Examiner* — Karabi Guharay
(74) *Attorney, Agent, or Firm* — Innovation Counsel LLP

(57) ABSTRACT

Instead of sealing together the upper and lower panels of a display device with only a solid-filled sealing material, a vacuum region is provided in suction-force-applying communication with at least one of the panels and anchored to the other so as to pull the panels together due to pressure difference with and ambient atmosphere. The display device includes: a vacuum region defined by a pair of spaced apart, resilient and gas impermeable support barriers formed to integrally extend from at least one of the upper and lower panels of the display device and having the other end in vacuum region closing contact with the other display panel where the vacuum region is positioned in a peripheral area of the display device.

20 Claims, 9 Drawing Sheets

(56) References Cited

FOREIGN PATENT DOCUMENTS

| KR | 1020080076042 A | 8/2008 |
|----|-----------------|--------|
| KR | 1020080108743 A | 12/2008 |
| KR | 1020110020050 A | 3/2011 |
| KR | 1020110106735 A | 9/2011 |
| KR | 1020120007175 A | 1/2012 |
| KR | 1020120018978 A | 3/2012 |
| KR | 1020120026316 A | 3/2012 |
| KR | 1020120028443 A | 3/2012 |

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2012-0088890 filed in the Korean Intellectual Property Office on Aug. 14, 2012, the entire contents of which application are incorporated herein by reference.

BACKGROUND (a) Technical Field

The present disclosure of invention relates to a display device and a manufacturing method thereof.

(b) Description of Related Technology

Liquid crystal displays are one of the most common types of flat panel display devices currently in use. The typical Liquid Crystal Display (LCD) includes two spaced apart panels and a liquid crystal material layer interposed therebetween. In a typical configuration, one of the spaced apart panels is provided with a plurality of field generating electrodes such as pixel electrodes and the other with a common electrode, although other configurations (e.g., pixel electrodes and common electrode on a same panel) are possible and the LCD's generally include other components such as color filters, polarizing sheets and the like.

In operation, the liquid crystal display generates an electric field extending through the liquid crystal material layer, for example by applying voltage across its field generating electrodes, and the generated field determines an optical orientation direction of liquid crystal molecules of the liquid crystal layer, thus controlling polarization of passing through light so as to display desired images.

In addition to the LCD type, flat panel display devices may include other types including a plasma display, an organic light emitting diode (OLED) display, an electrophoretic display, an electrowetting display, and the like. Many of these other types, like the LCD type, are typically assembled to have two spaced apart panels that are held together in a spaced apart configuration for various reasons. The present disclosure is not limited to Liquid Crystal Displays (LCDs).

Recently, there has been a desire to cause display devices to become lighter and thinner, and to consume lower power. In addition to the above desires, it has become desirable that a width of a bezel portion of the display device become smaller. When the width of the bezel portion becomes smaller, a size of the display device looks slim and thus the design is excellent, and when a large-sized display device is manufactured by using a plurality of display panels, an interval between adjacent display panels may be smaller.

In order to narrow the width of the bezel portion, a width of a non-displaying peripheral area surrounding a display area of the display device needs to be decreased, However, at the same time, various wires, electronic driver components, and a sealant are conventionally provided in the peripheral area of the display panel and thus there is a limit to how far one can go to reduce the size of the peripheral area.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a display device capable of having a smaller and lower weight bezel area than display devices which use a solid-filled sealant for holding together the spaced apart panels of the display device.

More specifically, the pressure of ambient air is used to hold together the spaced apart panels of the display device by providing one or more lower-than-ambient pressure zones between the panels. While the term, "vacuum" is used herein for sake of convenience, it is to be understood that this does not mean vacuum in an absolute sense, but rather also any gas filled volume whose internal pressure is substantially below ambient pressure such that the pressure difference helps to secure together a set of spaced apart panels having the vacuum region between them. A vacuum region, as the term is used herein, need not be devoid of functional display device components such as electronic driver components, interconnect components and the like so that such a vacuum region can serve the plural functions of not only helping to hold together the display panels, but also to contain therein one or more functional components of the display device.

In an exemplary embodiment of the present disclosure there is provided a display device including: a pair of support barriers integrally formed and terminated on at least a first of an upper and a lower display device panel and having opposed other ends (terminals thereof) being in contact with the second display panel; and a vacuum region maintained in a volumetric space partitioned by the combination of the upper panel, the lower panel and the pair of support barriers The display device may include a display area and a peripheral area disposed around the display area, and the pair of support barriers and the vacuum region may be positioned in the peripheral area.

The pair of support barriers may include an inner support barrier and an outer support barrier, the inner support barrier may be adjacent to the display area and have a square column structure having an opening surrounding the display area, and the outer support barrier may surround the vacuum region and have a square column structure having an opening.

The display area may be positioned in the opening of the inner support barrier, and the display area, the inner support barrier and the vacuum region may be positioned in the opening of the outer support barrier.

The display device may further include an outlet formed in at least one display panel of the upper panel and the lower panel, in which the outlet may be formed in a partial region of the vacuum region.

The display device may further include a groove (or other surface area increasing feature) formed on at least one display panel of the upper panel and the lower panel along the vacuum region where the surface area increasing feature works to increase a suction force exerted by a pressure difference between a pressure present inside the vacuum region and a pressure of an outside ambient.

The outlet may be formed in a partial region of the groove.

The display device may further include a shielding member configured to block the outlet from the outside.

The display device may further include an additional inner support barrier formed between the inner support barrier and the display area.

An adhesive filler may be formed between the additional inner support barrier and the inner support barrier.

The display device may further include an additional outer support barrier formed outside the outer support barrier.

An adhesive filler may be formed between the outer support barrier and the additional outer support barrier.

The display device may further include a support member formed by being in contact with at least one of the inner support barrier and the outer support barrier and at least one of the upper panel and the lower panel.

The inner support barrier may surround a liquid crystal layer.

Another exemplary embodiment provides a manufacturing method of a display device, including: forming a pair of support barriers on at least one display panel of an upper panel and a lower panel; and vacuum-attaching the upper panel and the lower panel to each other, in which in the vacuum-attaching of the upper panel and the lower panel, the other display panel of the upper panel and the lower panel is in contact with one end of the pair of support barriers, and a region between the pair of support barriers is formed as a vacuum region.

The manufacturing method of a display device may further include forming a groove extending along the vacuum region on at least one display panel of the upper panel and the lower panel.

The manufacturing method of a display device may further include forming an outlet configured to discharge (pump out) air and/or other fluids from the vacuum region, the outlet being disposed on at least one display panel of the upper panel and the lower panel.

The manufacturing method of a display device may further include sealing the outlet.

The vacuum-attaching of the upper panel and the lower panel may include detecting whether and when the other display panel of the upper panel and the lower panel are in contact with one end of the pair of support barriers; and beginning to discharge air from a region between the pair of support barriers after the other display panel of the upper panel and the lower panel are in contact with one end of the pair of support barriers.

The manufacturing method of a display device may further include depositing a liquid crystal layer on one display panel of the upper panel and the lower panel.

According to the exemplary embodiments of the present disclosure of invention, it is possible to provide a liquid crystal or other display having a small bezel by reducing a width of a sealing mechanism of the liquid crystal or other display device. Further, it is possible to provide a smaller bezel even in various display devices other than liquid crystal and in which an upper panel and a lower panel are attached to each other.

DETAILED DESCRIPTION

Figure 1:
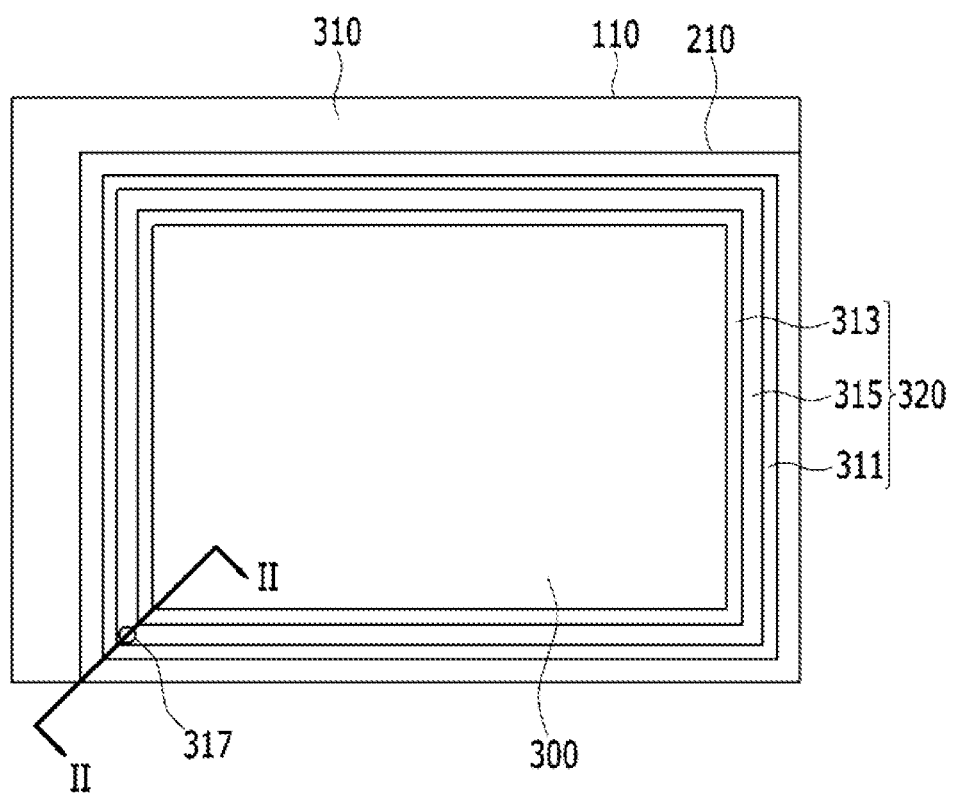
FIG. 1 is a top plan view of a liquid crystal display (LCD) according to an exemplary embodiment of the present disclosure of invention.

The present disclosure of invention will be described more fully hereinafter with reference to the accompanying drawings, in which exemplary embodiments are shown. As those skilled in the art would realize in light of the present disclosure, the described embodiments may be modified in various different ways, all without departing from the spirit or scope of the present teachings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a display device according to a first exemplary embodiment of the present disclosure will be described in detail with reference to FIGS. 1 and 2.

FIG. 1 is a plan view of a liquid crystal display according to the first exemplary embodiment. FIG. 2 is a cross-sectional view taken along line II-II of FIG. 1.

A liquid crystal display according to the exemplary embodiment includes a lower panel 110 which could include a plurality of thin film transistors, an upper panel 210 which could include a plurality of color filters and which is disposed corresponding to the lower panel 110, and a liquid crystal layer 3 positioned between the lower panel 110 and the upper panel 210 and including liquid crystal molecules.

In terms of more detail, the lower panel 110 typically includes a plurality of gate lines and data lines which are insulated from each other and extend in different directions so as to cross each other. Respective ones of the gate lines and the data lines are respectively connected with a control (e.g., gate) terminal and an input (e.g., source) terminal of a respective thin film transistor (TFT) while an output (e.g., drain) terminal of the thin film transistor is connected with a respective pixel electrode.

Meanwhile, in the upper panel 210 which faces the lower panel 110 there typically are provided: a plurality of differently colored color filters, a light blocking member (e.g., black matrix), a common electrode, a spacer, and a pair of support barriers 311 and 313 integrally extending from the upper panel 210. The light blocking member has a plurality of light-passing openings. Respective ones of the differently colored, color filter are positioned in the respective openings. The common electrode may be formed throughout the entire area of the upper panel 210 and is positioned below the light blocking member and the color filters. A column spacer is positioned below the common electrode.

In the liquid crystal display according to the exemplary embodiment, the lower panel 110 is formed to be wider than the upper panel 210, and the liquid crystal display includes a peripheral area including a pads region 310 and an intermediate region 320 and a display area 300. However, according to an exemplary embodiment, the lower panel 110 may be formed to be narrower than the upper panel 210. In this latter case, the pads region may be formed in the upper panel 210.

The pads region 310 is an interconnect portion which is exposed for interconnecting with other circuitry in the area where the lower panel 110 is wider than the upper panel 210. The display area 300 is an area in which the upper panel 210 and the lower panel 110 are overlapped with each other, and an array of pixel units are formed there to display a desired image. The intermediate region 320 is positioned between the pads region 310 and the display area 300. The intermediate region 320 includes at least a pair of spaced apart support barriers 311 and 313 and a vacuum region 315 that is maintained between the support barriers 311 and 313.

In more detail, the pair of support barriers 311 and 313 are formed in the intermediate region 320. The pair of support barriers 311 and 313 sealingly surround the display area 300 for example in the form of a square tube having an opening at the center of the tubular shape where the vacuum region is formed. The support barriers are denoted as an inner support barrier 313 and an outer support barrier 311. The inner support barrier 313 is adjacent to the display area 300 and has a square column structure surrounding the display area 300 and the liquid crystal layer 3. The outer support barrier 311 has a square column structure surrounding the vacuum region 315. The display area 300 is positioned in an interior opening defined by the combination of the inner support barrier 313, the vacuum region 315 and the inner support barrier 313. The pair of support barriers 311 and 313 may be each made of a material having an excellent gas impermeability property and a good elastic deformation range so as to robustly support and maintain the relatively low pressure of the vacuum region 315. Further, the pair of support barriers 311 and 313 may be made of a same material as used in at least one of the column spacer, the color filter, and the light blocking member or it may further include or be made of an organic material having the gas impermeability property. In the case where the pair of support barriers 311 and 313 is made of the organic material, the pair of support barriers 311 and 313 may be formed together in a same process that forms an organic layer formed on the upper panel 210. Further, in the case where the pair of support barriers 311 and 313 is made of the same material as one of the column spacer, the color filter, and the light blocking member, the pair of support barriers 311 and 313 may be formed together when the corresponding material is formed.

The vacuum region 315 is formed between the inner support barrier 313 and the outer support barrier 311. The inner support barrier 313 and the outer support barrier 311 are formed so as to enable forming the vacuum region 315 and holding the low pressure of the vacuum region 315. The upper panel 210 and the lower panel 110 are caused to adhere to each other at least due to bonding force provided by the vacuum region 315 (or more precisely by the higher pressure of the ambient air). Additionally, the support barriers 311 and 313 keep the liquid crystal layer 3 blocked from the outside. The vacuum region 315 also has a square column shape having an opening like the inner support barrier 313 and the outer support barrier 311 and is formed in a space which is partitioned by the inner support barrier 313 and the outer support barrier 311. The upper panel 210 and the lower panel 110 adhere to each other at least due to low pressure of the vacuum region 315 although it is within the contemplation of the disclosure that some further adhering force may be provided by one or more adhesives. An advantage of the vacuum region 315 is that, unlike a solid filled sealing mass, the vacuum region per se has a lower mass and thus a lower weight. As mentioned however, it is within the contemplation of the present disclosure to have the vacuum region 315 serve plural duties including that of containing therein, one or more electronic components and/or heat transfer elements.

Further, in the definition of the vacuum region 315, a groove 316 may be formed in the upper panel 210. In one embodiment, the groove 316 is formed along the path of the vacuum region 315 and it has a square groove structure. The side of the groove 316 coincides with a boundary (or the sides of the support barriers 311 and 313) of the vacuum region 315 (see FIG. 2) or may be positioned below the support barriers 311 and 313 or at the sides of the support barriers 311 and 313 with a regular distance according to an exemplary embodiment. In the case where a distance between the upper panel 210 and the lower panel 110 is narrow, and spacing apart distance between the support barriers 311 and 313 is narrow and thus a desired vacuum force is not sufficiently formed by the interior surface area where the narrow vacuum region 315 meets a planar surface area of the upper panel 210, and as a result, the upper panel 210 and the lower panel 110 are not strongly adhered to each other, the groove 316 may be additionally formed so as to thereby increase the surface area of at least one of the panels that is subject to the vacuum of the vacuum region so as to thereby increase the product of the subjected surface area (SA) multiplied by the pressure difference (PD) between the ambient and the vacuum region (F=SA*PD). In this case, the groove 316 forms a sufficiently increased surface area (SA) that is subjected to the pressure difference (PD) between external air pressure and the vacuum region 315, and as a result, the upper panel 210 and the lower panel 110 may adhere more forcefully to each other. Further, a thickness of the vacuum region 315 may be larger than a cell gap of the liquid crystal layer 3 injected in the display area 300 due to the groove 316.

Meanwhile, according to another exemplary embodiment, the groove 316 may not be formed. In an exemplary embodiment in which the groove 316 is not formed, the vacuum region 315 may have the same thickness as the cell gap of the liquid crystal layer 3 injected in the display area 300.

In a partial region of the groove 316 of the vacuum region 315, an outlet 318 is formed for pumping out gas (e.g., air) from the vacuum region and a shielding (sealing/valving) member 317 is provided for sealing in the vacuum of the vacuum region 315 and separating it from the outside after forming the vacuum of the vacuum region 315.

In an exemplary embodiment in which the groove 316 is not formed, the outlet 318 may be formed in a partial region of the vacuum region 315. According to an exemplary embodiment, the groove 316 and the outlet 318 may be formed on the same display panel (upper panel or lower panel) and may be formed on different display panels.

As described above, the inner support barrier 313 and the outer support barrier 311 may be formed with a thickness and a material capable of supporting an air pressure difference between the vacuum region 315 and the outside.

Meanwhile, according to an alternate exemplary embodiment, at least one of the common electrode, the light blocking member, the color filter and the spacer which are typically formed on the upper panel 210 may be instead integrally formed on the lower panel 110.

Further, according to an exemplary embodiment, the inner support barrier 313 and the outer support barrier 311 may be formed to integrally extending from the lower panel 110. Alternatively, one of the support barriers 311 and 313 may be formed to integrally extending from a first of display panels 110 and 210 while the other integrally extends from the second.

Meanwhile, although not shown, an alignment layer is formed between the liquid crystal layer 3 and the upper panel 210 and lower panel 110 to control an initial alignment direction of the liquid crystal molecules.

Here below, it will be explained in a comparative sense how much a width of the peripheral area may be decreased in the liquid crystal display according to the exemplary embodiment with reference to FIGS. 3 and 4.

Figure 3:
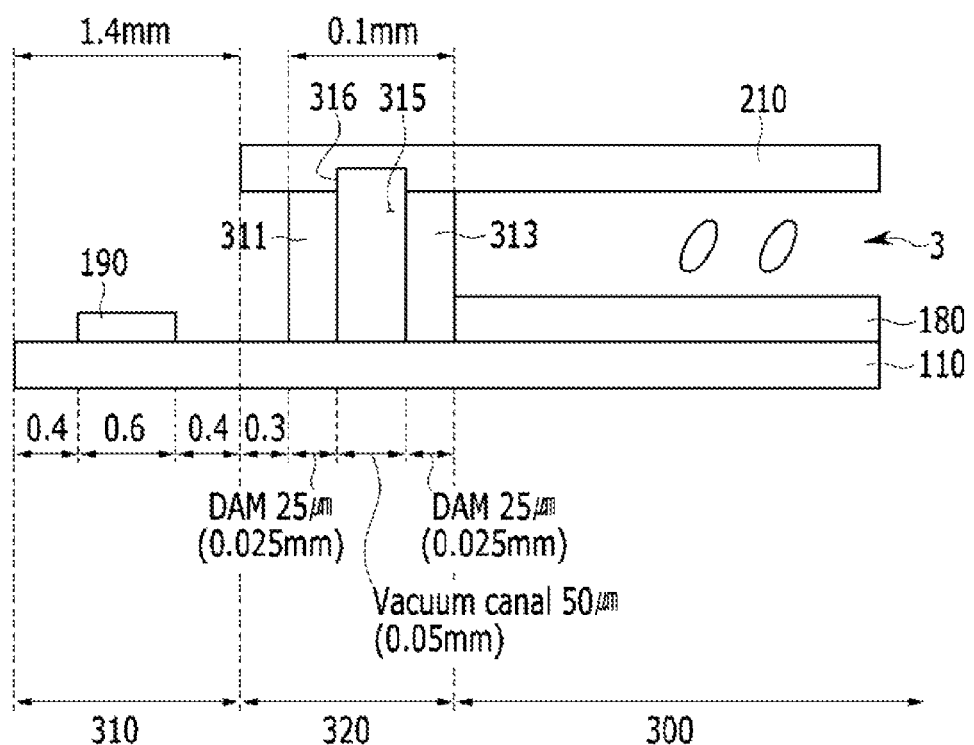
FIG. 3 is a cross-sectional view illustrating a width of a peripheral area of the liquid crystal display according to the exemplary embodiment of FIG. 1.
Figure 4:
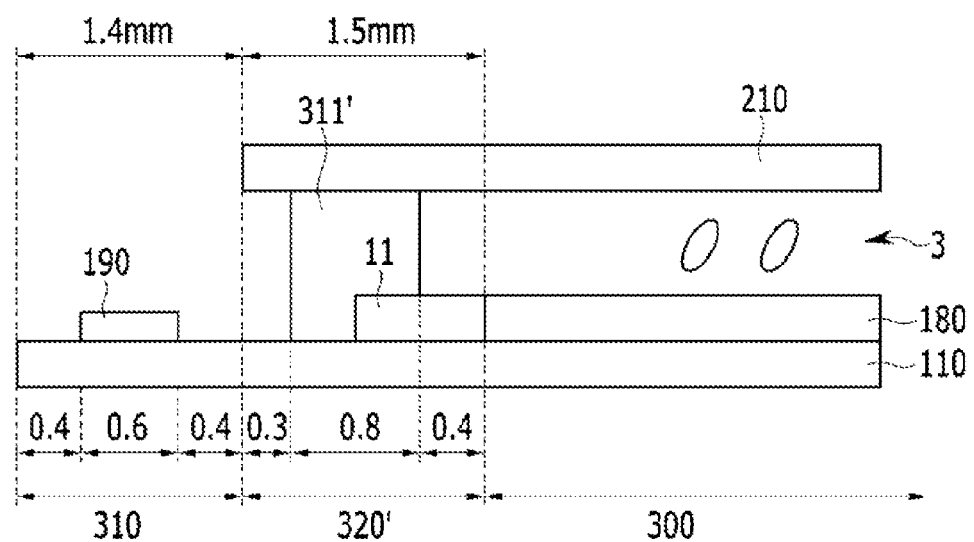
FIG. 4 is a cross-sectional view illustrating a width of a peripheral area of a liquid crystal display according to a Comparative Example.

FIG. 3 is a cross-sectional view illustrating a width of a peripheral area of the liquid crystal display according to the exemplary embodiment of the present disclosure, while FIG. 4 is a cross-sectional view illustrating a width of a peripheral area of a liquid crystal display according to a Comparative Example.

First, FIG. 3 illustrates a width of the peripheral area of the liquid crystal display according to an exemplary embodiment in accordance with the present disclosure wherein a width of the pads region 310 is 1.4 mm and a width of the intermediate region 320 between the pads region 310 and the display area 300 is 0.4 mm. The width dimension of the intermediate region 320 consists of an overhang width between an end of the upper panel 210 and the outer support barrier 311 which is 0.3 mm, plus a width between the outward facing sidewalls of the support barriers 311 and 313 (which dimension includes the width of the vacuum region 315) where this sidewall-to-sidewall dimension is 0.1 mm. The latter sidewall-to-sidewall dimension of 0.100 mm is composed of a respective width of each of the pair of support barriers 311 and 313 which is 0.025 mm, and the width of the vacuum region 315 therebetween which is 0.050 mm.

By contrast, in for the Comparative Example of FIG. 4 where the upper panel 210' and the lower panel 110' are sealed together by using a solid-filled sealant 311'; the width of the pads region 310 is 1.4 mm (just like the exemplary embodiment of FIG. 3), but a width of a intermediate region 320' is a much larger 1.50 mm (as compared to the 0.10 mm value of FIG. 3). More specifically, with regard to the width dimension of intermediate region 320' of FIG. 4, the included width of the solid-filled sealant 311' is 0.80 mm, the included width of a space (alignment layer region) generated between the sealant 311' and the display area 300 by an alignment layer 11 which is positioned at the lower left of the sealant 311' is 0.40 mm, and the included overhang width between the end of the upper panel 210 and the sealant 311' is 0.3 mm.

When comparing the respective structures of FIG. 3 and FIG. 4, the widths of the corresponding pads region 310 and 310' are the same. The corresponding widths between the end of the upper panel 210 and the outer support barrier 311 or the sealant 311' in the intermediate regions 320 and 320' are the same. However, it can be readily verified that in the Comparative Example of FIG. 4, the width between the sealant 311' and the alignment layer region in the intermediate region 310' is total 1.20 mm, but in the exemplary embodiment of FIG. 3, the corresponding space is replaced with the pair of support barriers 311 and 313 and the vacuum region 315, and a width of the corresponding space is decreased to 0.10 mm (in other words, reduced by 90% or more as compared to the corresponding 1.20 mm width value of comparative FIG. 4). That is to say, in the exemplary embodiment of FIG. 3 as compared with the Comparative Example of FIG. 4, the width of the intermediate region 320 may be decreased by 1.10 mm, and as a result, a bezel corresponding to the pad region 310 and the intermediate region 320 may also be decreased from 2.90 mm to 1.80 mm, in other words, by the given amount of 1.10 mm. (Thus the width of the bezel is decreased by about 40%.) Therefore, it is possible to form the display device having a slim bezel. Additionally, because the vacuum region 315 is not filled with the solid material of the solid-filled sealant 315' of FIG. 4, the vacuum region 315 can have a smaller weight. Accordingly, the display device that uses the less-filled vacuum region 315 can be not only smaller in regard to the size of its bezel area but also lighter at least in regard to the materials that form the intermediate area 320.

Further, in the manufacture of the exemplary embodiment of FIG. 3, a curing process of the sealant 311' is not required and thus a processing time may be shortened, and since the sealant 311' is cured at a temperature of 100° C. or more, when the curing process is removed, thermal deformation of other constituent elements of the liquid crystal display may not occur. An additional process is a process of forming the groove 316 on the display panel, and since the groove 316 may be formed by etching, the processing time is shortened.

Hereinafter, another exemplary embodiment in accordance with the present disclosure of invention will be described with reference to FIGS. 5 to 7.

Figure 5:
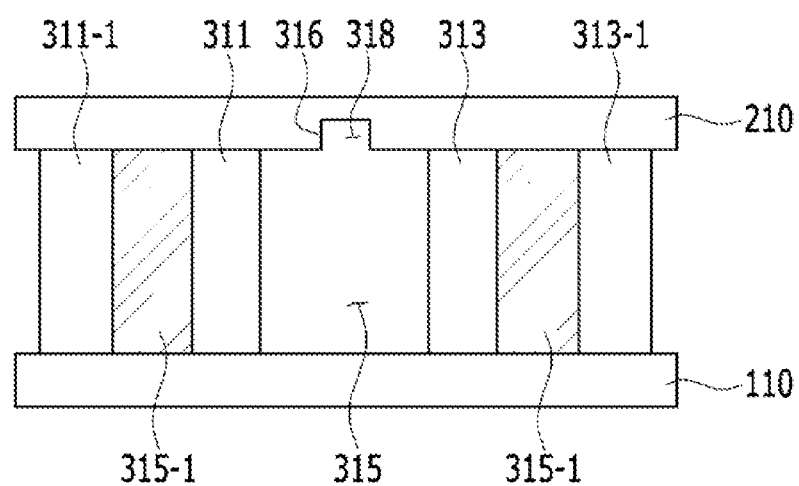
FIGS. 5 to 7 are cross-sectional views of a liquid crystal display according to another exemplary embodiment.
Figure 6:
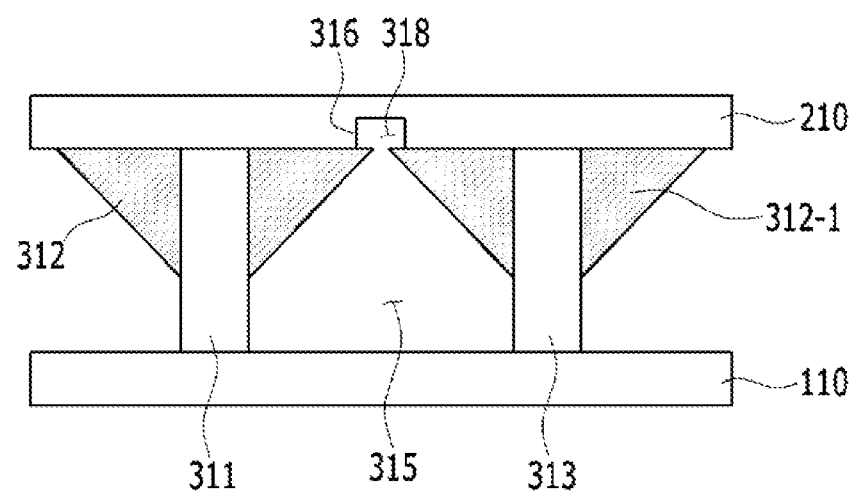
Figure 7:
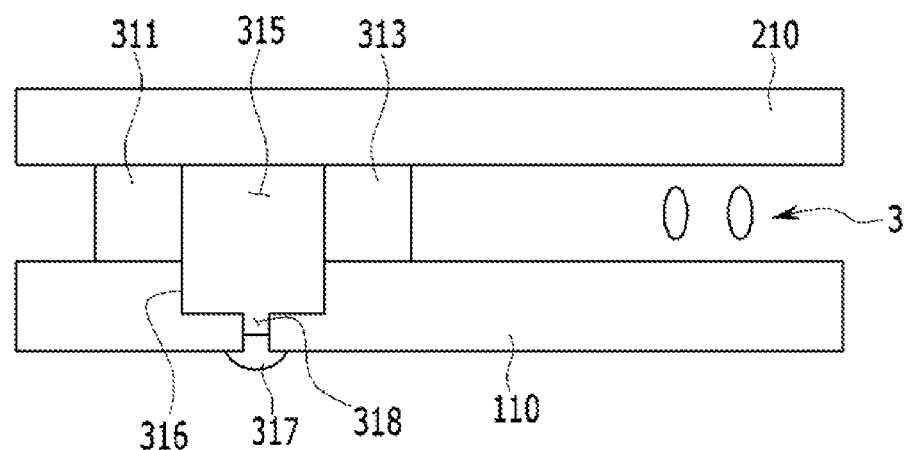

FIGS. 5 to 7 are cross-sectional views of a liquid crystal display according to another exemplary embodiment.

First, FIGS. 5 and 6 illustrate an exemplary embodiment which reinforces the pair of support barriers 311 and 313 partitioning and supporting the vacuum region 315.

In FIG. 5, a structure having two pairs of support barriers is illustrated.

As illustrated in FIG. 5, the inner support barrier 313, the outer support barrier 311, and the vacuum region 315 formed between the two support barriers 311 and 313 are present, and a pair of additional (ancillary) support barriers 311-1 and 313-1 that are formed at the respective outsides thereof.

That is, the additional outer support barrier 311-1 and the additional inner support barrier 313-1 are respectively made of the same material as the inner support barrier 313 and the outer support barrier 311. The pair of the additional support barriers 311-1 and 313-1 is formed in a square column shape having an opening around the display area 300 like the pair of support barriers 311 and 313. A filler material 315-1 (not a vacuum) made of a material such as epoxy is formed between the pair of additional support barriers 311-1 and 313-1 and the pair of support barriers 311 and 313. The pair of additional support barriers 311-1 and 313-1 and the filler 315-1 are formed in order to prevent the vacuum region 315 from being broken due to a crack defect being inadvertently formed in one of the pair of support barriers 311 and 313 and also to reinforce the pair of support barriers 311 and 313. As such, according to the exemplary embodiment, the width of the intermediate region 320 is increased as compared with the exemplary embodiment of FIG. 3, but since the increased width is about 0.10 mm, the liquid crystal display may still have a bezel having a smaller width than the Comparative Example of FIG. 4.

According to an exemplary embodiment, the corresponding region may be formed of a vacuum region instead of the filler 315-1. In this case, a liquid crystal display having two or more separate vacuum regions 315 is formed. Although the two or more vacuum regions 315 are formed, the liquid crystal display may still have a bezel having a smaller width than the Comparative Example of FIG. 4.

Even in the exemplary embodiment of FIG. 5, the groove 316 and the outlet 318 are formed in the vacuum region 315, and although not illustrated in FIG. 5, the shielding member 317 blocking the outlet 318 is further included. In the exemplary embodiment of FIG. 5, the groove 316 has a structure formed to come in a predetermined distance from (offset from) the sides of the pair of support barriers 311 and 313. This does not alter the additional surface area (SA) provided by the groove 316 since it is the depth and not the width of the groove 316 that creates that additional surface area (SA). However, according to an exemplary other embodiment, a boundary of the groove 316 may coincide with a boundary (or the sides of the support barriers 311 and 313) of the vacuum region 315 (see FIG. 2) or may be disposed below the pair of support barriers 311 and 313.

In the exemplary embodiment of FIG. 5, the pair of additional support barriers 311-1 and 313-1 serves to primarily prevent a liquid crystal material from flowing into the vacuum region 315 when air is discharged in the forming process of the vacuum region 315.

The exemplary embodiment of FIG. 5 illustrates a structure in which a pair of additional support barriers is formed, but alternatively, only one additional support barrier thereof may be formed.

Meanwhile, in the exemplary embodiment of FIG. 6, in order to reinforce the pair of support barriers 311 and 313, prism-like support members 312 and 312-1 are additionally formed on the pair of support barriers 311 and 313 and one display panel (the upper panel 210 in the exemplary embodiment of FIG. 6). The support members 312 and 312-1 are formed to be in contact with the pair of support barriers 311 and 313 and one display panel. Hereinafter, the display panel with the support barriers 311 and 313 is referred to as one display panel, and a display panel opposed thereto is referred to as the other display panel.

The support members 312 and 312-1 serve to improve adhesion between the pair of support barriers 311 and 313 and the upper panel 210 and/or to better prevent the liquid crystal material or air of the display area 300 or pad region 310 from entering (leaking into) the vacuum region 315.

That is, in the exemplary embodiment of FIG. 6, the pair of support barriers 311 and 313 is formed on one display panel, and the support members 312 and 312-1 are formed on one end (hereinafter, referred to as the other end) which is far away from one display panel of the pair of support barriers 311 and 313. Thereafter, after the other display panel and one display panel adhere to each other, the air of the vacuum region 315 is discharged, and in this case, the support members 312 and 312-1 prevent the liquid crystal material or air from entering the vacuum region 315 by improving adhesion with and adhesive contact area with the other display panel. That is, the support member 312-1 formed on the inner support barrier 313 better prevents the liquid crystal material from entering the vacuum region 315 from the display area 300, and the support member 312 formed on the outer support barrier 311 prevents the air from entering the vacuum region 315 from the outside and the pad region 310. As a result, the support members 312 and 312-1 serve to assist in forming and holding the vacuum region 315. Here, the support members 312 and 312-1 and the support barriers 311 and 313 may be made of the same material or different materials, and the support members 312 and 312-1 may contain organic materials. As illustrated in FIG. 6, cross-sections of the support members 312 and 312-1 have triangular shapes. The support members 312 and 312-1 have widths which are gradually increased or decreased from both side walls of the support barriers 311 and 313 and are formed along the support barriers 311 and 313. Meanwhile, according to an exemplary embodiment, the cross sections of the support members 312 and 312-1 may have various polygonal shapes or globular shapes.

Meanwhile, according to another exemplary embodiment, the support members 312 and 312-1 may be formed on one end which is adjacent to one display panel with the pair of support barriers 311 and 313, and may be formed on both ends (that is, both the other end and one end) of the pair of support barriers 311 and 313. In addition, the support members 312 and 312-1 may be formed only at the inner support barrier or the outer support barrier.

In the exemplary embodiment of FIG. 6, the groove 316 and the outlet 318 are formed in the vacuum region 315, and although not illustrated in FIG. 6, the shielding member 317 blocking the outlet 318 is further included. In the exemplary embodiment of FIG. 6, the groove 316 has a structure formed to come in a predetermined distance from the sides of the pair of support barriers 311 and 313. However, according to an exemplary embodiment, a boundary of the groove 316 may coincide with a boundary (or the sides of the support barriers 311 and 313) of the vacuum region 315 or may be disposed below the pair of support barriers 311 and 313. Further, in FIG. 6, the groove 316 is illustrated with a structure in which one side wall is positioned below the support members 312 and 312-1, but according to an exemplary embodiment, the ends of the support members 312 and 312-1 and the side wall of the groove 316 may coincide with each other or spaced apart from each other with a predetermined interval.

Figure 2:
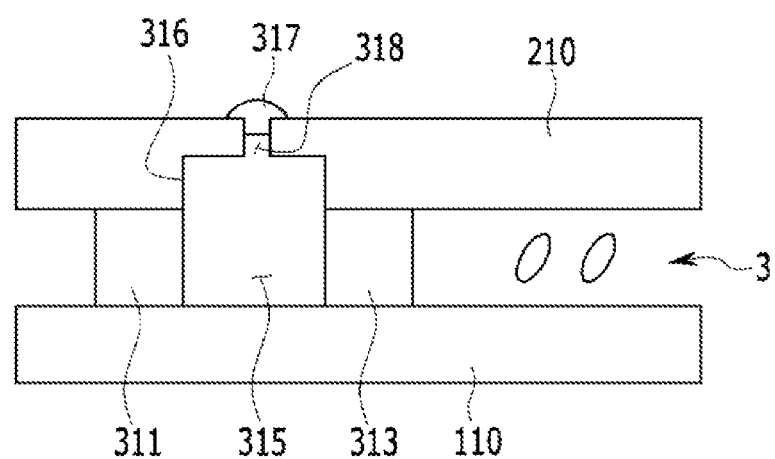
FIG. 2 is a cross-sectional view taken along line II-II of FIG. 1.

Meanwhile, FIG. 7 illustrates yet another exemplary embodiment in which the groove 316 and the outlet 318 are formed on the lower panel 110 unlike the exemplary embodiment of FIG. 2. As a result, the shielding member 317 is also formed on the lower panel 110. In FIG. 7, the pair of support barriers 311 and 313 is integrally formed on the upper panel 210 or integrally formed on the lower panel 110 and thereafter, may be attached at its non-integral end to the other display panel.

Hereinafter, a manufacturing method of the liquid crystal display according to the exemplary embodiment of the present invention will be described.

Figure 8:
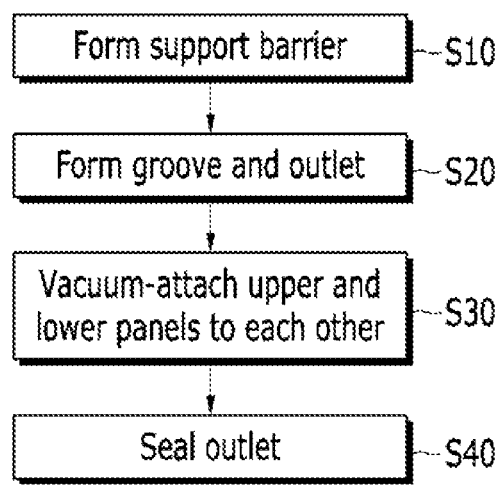
FIG. 8 is a flowchart illustrating a manufacturing method of the liquid crystal display according to an exemplary embodiment.

FIG. 8 is a flowchart illustrating a manufacturing method of the liquid crystal display according to an exemplary embodiment in accordance with the present disclosure of invention.

In FIG. 8, a manufacturing method of the liquid crystal display is schematically illustrated by a flowchart, and hereinafter, the method will be described based on the exemplary embodiment in which the pair of support barriers 311 and 313 are monolithically integrated with and positioned on the upper panel 210.

First, the pair of support barriers 311 and 313 are monolithically integrally formed on the upper panel 210. (Step S10) That is to say, in one embodiment, a light blocking member, a color filter, a common electrode and the pair of support barriers 311 and 313 are formed on the upper panel 210. After the light blocking member, the color filter, and the common electrode are formed on an insulation substrate, the pair of support barriers 311 and 313 are monolithically integrally formed thereon in a square column shape having an opening which surrounds the display area 300 at positions of the peripheral areas 310 and 320. The inner support barrier 313 is formed to be closer to the display area 300, and the spaced apart outer support barrier 311 is formed to be farther away from the display area 300 and is longer in its side dimensions than the inner support barrier 313. In this case, the pair of support barriers 311 and 313 may be made of an organic material. Further, the pair of support barriers 311 and 313 may be made of a same material as at least one of the light blocking member or the color filter according to an exemplary embodiment. In this case, the pair of support barriers 311 and 313 may be formed at the same time and in the same process chamber when the light blocking member or the color filter is formed on the insulation substrate.

Thereafter, the groove 316 and the outlet 318 are formed in a region between the pair of support barriers 311 and 313 of the upper panel 210. (Step S20) The groove 316 and the outlet 318 may be formed by one or more of laser-etching, wet-etching or dry etching the insulation substrate. In the case where glass is used as the insulation substrate, the laser etching or the wet etching using an etchant containing HF may be performed.

The groove 316 may be formed according to any one exemplary embodiment of FIGS. 2, 5, 6, and 7, and a position of the outlet 318 may also be freely formed according to an exemplary embodiment. Since the outlet 318 is a place where air is discharged in order to form the vacuum of the vacuum region 315, the outlet 318 may be formed in the vacuum region 315.

Meanwhile, the lower panel 110 is completed by a separate process. That is, a gate line, a data line, a thin film transistor, a pixel electrode, and the like are formed on the insulation substrate to complete the lower panel 110. A timing of completing the lower panel 110 may be earlier or later than a timing of completing the upper panel 210.

Thereafter, a liquid crystal material is dropped into the upper panel 210 or the lower panel 110 by a one drop filling (ODF) method, an inkjet method, or the like.

Thereafter, the upper panel 210 and the lower panel 110 are vacuum-attached to each other. (S30) That is, the lower panel 110 is in contact with the upper panel 210 with the pair of support barriers 311 and 313, the groove 316 and the outlet 318, and the upper panel 210 and the lower panel 110 adhere to each other while forming the vacuum region 315 in the region between the pair of support barriers 311 and 313 by removing the air through the outlet 318.

Thereafter, the outlet 318 is sealed in order to prevent the air from flowing into the vacuum region 315. (S40) In the exemplary embodiment, the outlet 318 is sealed by forming the shielding member 317 outside the outlet 318. However, according to another exemplary embodiment, various alternate sealing methods may be used.

At step S30, that is, when both of the display panels are vacuum-attached to each other, a speed for discharging the air through the outlet 318 needs to be controlled. In the case where the speed for discharging the air is fast, the liquid crystal material positioned inside the inner support barrier 313 may be sucked into the vacuum region 315. The reason is that the liquid crystal material is not sucked into the vacuum region 315 because a space does not exist between the one display panel with the inner support barrier 313 and the inner support barrier 313, but the liquid crystal material may flow between the other display panel and the inner support barrier 313 before adhering. Since only the air flow into the outer support barrier 311, the air has only to be discharged, but there is problem in that the liquid crystal material may cause damage to a vacuum device used for discharging air. Therefore, it is necessary that the liquid crystal material is prevented from flowing therebetween by properly decreasing the speed for discharging the air through the outlet 318 as the vacuum is formed. The speed for discharging the air may depend on a structure of the support barrier of the liquid crystal display, a liquid crystal material, and the like.

In order to control the speed, an exemplary embodiment of the present invention illustrated in FIG. 9 will be described.

Figure 9:
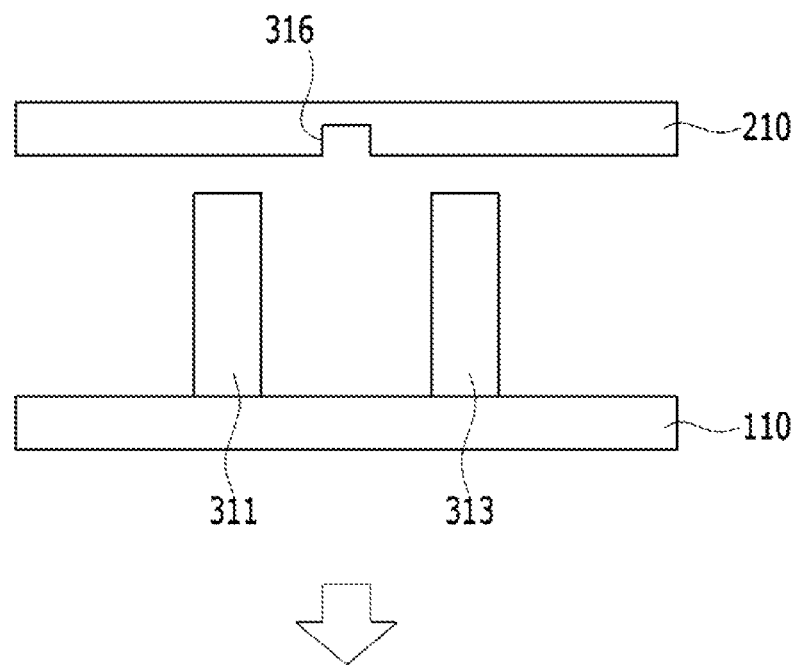
FIG. 9 is a diagram illustrating a method of attaching upper and lower panels of the liquid crystal display according to an exemplary embodiment.
Figure 9:
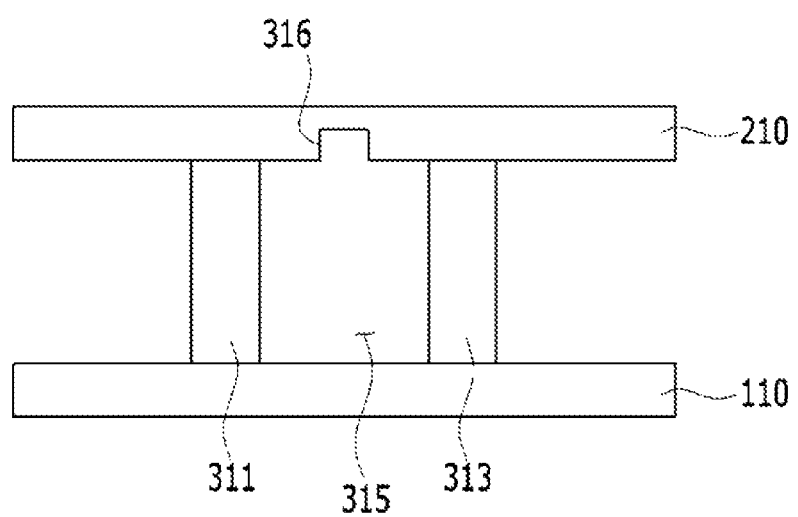

FIG. 9 is a diagram illustrating a method of attaching upper and lower panels of a liquid crystal display according to an exemplary embodiment of the present disclosure.

In the exemplary embodiment of FIG. 9, when the upper and lower panels of a liquid crystal display are attached to each other, a detector is used to determine whether and/or to what degree the upper panel 210 and the lower panel 110 are in contact with each other. That is to say, a separate sensor (not shown) is used to detect the spacing between the support barriers 311 and 313 and the other display panel as they are brought into contact with each other and to detect when the contact is fully made (see a lower diagram of FIG. 9). As this is occurring, the air starts to be discharged (pumped out) through the outlet 318 at controlled rates. That is, like an upper diagram of FIG. 9, when the support barriers 311 and 313 and the other display panel are separated from each other, the air is not discharged or is pumped at a very slow rate. On the other hand, when a state closer to that that of, or fully that of the lower diagram of FIG. 9 is reached, in other words, after the support barriers 311 and 313 and the other display panel are substantially in contact with each other, the air is discharged (pumped out) at an increased rate. This is done because the liquid crystal material of the upper part of FIG. 9 is in an unsealed state where it may readily be pulled out by fast streaming air nearby and thus overflow if the air is rapidly discharged before the support barriers 311 and 313 and the other display panel are in substantially full contact with each other.

The method exemplary embodiments of FIGS. 8 and 9 may be applied to the exemplary embodiment of FIGS. 5 to 7 and various other exemplary embodiments, in addition to the exemplary embodiment of FIG. 2. That is, in the forming of the support barrier (S10) of FIG. 8, modified additional support barrier and support member may be further formed like FIGS. 5 and 6, and in FIG. 9, whether the additional support barrier and support member formed as described above are in contact with an opposed display panel is detected and the air may be discharged after contacting.

As described above, the liquid crystal display was described as a representative example of a display device. However, the present disclosure of invention may be applied to other forms of display devices (for example, organic light emitting diode display and the like) in which an upper panel and a lower panel are attached to each other.

While this disclosure of invention has been described in connection with what is presently considered to be practical exemplary embodiments, it is to be understood that the present teachings are not limited to the disclosed embodiments, but, on the contrary, the disclosure is intended to cover various modifications and equivalent arrangements included within the spirit and scope of the teachings.

What is claimed is:

1. A display device, comprising:
   a pair of spaced apart and substantially gas impermeable support barriers integrally connected at a respective integrally formed end to one of an upper panel and a lower panel of the display device and each having its non-integrally formed other end in contact with the respective other one of the upper panel and the lower panel; and
   a substantially evacuated vacuum region positioned between the spaced apart support barriers, the vacuum region being in a force exerting further coupling with at least one of the upper panel and the lower panel so as to force together the upper and lower panels due at least in part to a pressure difference between the vacuum region and an exterior atmosphere, wherein the display device comprises a display area and a peripheral area around the display area, the pair of support barriers comprising an inner support barrier and an outer support barrier, the inner support barrier completely and sealingly surrounding the display area, and the outer support barrier completely and sealingly surrounding the display area.

2. The display device of claim 1, wherein:
   the pair of support barriers and the vacuum region are positioned in the peripheral area.

3. The display device of claim 2, wherein:
   the inner support barrier is adjacent to the display area and has a square column structure having an opening surrounding the display area, and the outer support barrier surrounds the vacuum region and has a square column structure having an opening that overlaps with the vacuum region.

4. The display device of claim 3, wherein:
the display area is positioned in the opening of the inner support barrier, and
the combination of the display area, the inner support barrier and the vacuum region are positioned in the opening of the outer support barrier.

5. The display device of claim 4, further comprising:
a sealable outlet formed on at least one of the upper panel and the lower panel,
wherein the outlet communicates with the vacuum region for reducing pressure in the vacuum region.

6. The display device of claim 5, further comprising:
a groove formed in at least one of the upper panel and the lower panel along the vacuum region.

7. The display device of claim 6, wherein:
the outlet is formed in a partial region of the groove.

8. The display device of claim 4, further comprising:
a shielding member configured to block a vacuum of the vacuum region from being lost through the outlet.

9. The display device of claim 4, further comprising:
an additional inner support barrier formed between the inner support barrier and the display area.

10. The display device of claim 9, wherein:
a sealing filler is formed between the additional inner support barrier and the inner support barrier.

11. The display device of claim 4, further comprising:
an additional outer support barrier formed outside the outer support barrier.

12. The display device of claim 11, wherein:
a sealing filler is formed between the outer support barrier and the additional outer support barrier.

13. The display device of claim 4, further comprising:
a support member formed by being in contact with at least one of the inner support barrier and the outer support barrier and at least one of the upper panel and the lower panel.

14. The display device of claim 4, wherein:
the inner support barrier surrounds a liquid crystal layer.

15. A manufacturing method of a display device, comprising:
forming a pair of spaced apart and substantially gas impermeable support barriers each respectively being integrally connected at a respective integrally formed end to one of an upper panel and a lower panel of the display device, wherein the display device comprises a display area and a peripheral area around the display area, the pair of support barriers comprising an inner support barrier and an outer support barrier, the inner support barrier completely and sealingly surrounding the display area, and the outer support barrier completely and sealingly surrounding the display area; and
creating a vacuum in a vacuum region between the support barriers for thereby vacuum-attaching the upper panel and the lower panel to each other,
wherein in the vacuum region used in said vacuum-attaching of the upper panel and the lower panel maintains a suction force that pulls in at least one of the upper panel and the lower panel toward the vacuum region.

16. The manufacturing method of a display device of claim 15, further comprising:
increasing a surface area of the at least one of the upper and lower panels that is pulled in by the suction force so as to thereby increase the suction force for a predetermined pressure maintained in the vacuum region.

17. The manufacturing method of a display device of claim 15, further comprising:
forming an outlet configured to discharge air from the vacuum region, the outlet being provided on at least one of the upper panel and the lower panel.

18. The manufacturing method of a display device of claim 17, further comprising:
sealing the outlet.

19. The manufacturing method of a display device of claim 15, wherein:
the vacuum-attaching of the upper panel and the lower panel comprises
detecting whether the respective other one of the upper panel and the lower panel is in contact with a closing therewith end of at least one of the pair of support barriers; and
starting or increasing a rate of discharging of fluid from the vacuum region after said contact is detected.

20. The manufacturing method of a display device of claim 15, further comprising:
depositing a liquid crystal on one of the upper panel and the lower panel.

* * * * *